United States Patent [19]

Flannagan et al.

[11] Patent Number: 5,059,829
[45] Date of Patent: Oct. 22, 1991

[54] LOGIC LEVEL SHIFTING CIRCUIT WITH MINIMAL DELAY

[75] Inventors: Stephen T. Flannagan; Tai-Sheng Feng, both of Austin, Tex.

[73] Assignee: Motorola, Inc., Schaumburg, Ill.

[21] Appl. No.: 577,178

[22] Filed: Sep. 4, 1990

[51] Int. Cl.$^5$ .............. H03K 19/092; H03K 19/094; H03K 19/01; H03K 19/003
[52] U.S. Cl. .................... 307/475; 307/264; 307/446; 307/355; 307/495; 330/253
[58] Field of Search ............ 307/475, 264, 455, 270, 307/495, 497, 446, 570, 355; 330/253, 254

[56] References Cited

U.S. PATENT DOCUMENTS

| | | | |
|---|---|---|---|
| 4,829,479 | 5/1989 | Mitsumoto et al. | 307/495 X |
| 4,841,175 | 6/1989 | DeMan et al. | 307/497 X |
| 4,888,501 | 12/1989 | Sanwo et al. | 307/475 |
| 4,916,338 | 4/1990 | Metz | 307/446 X |

Primary Examiner—Edward P. Westin
Assistant Examiner—David R. Bertelson
Attorney, Agent, or Firm—Robert L. King

[57] ABSTRACT

A circuit enabling the conversion of a set of ECL and a set of CMOS logic levels has a differential amplifier, two emitter followers, a current switching circuit, and a level shifting circuit. The differential amplifier provides a common mode input to two emitter followers which switch very rapidly using ECL voltage levels. High operational speed is accomplished by providing a relaxation current during logic high-to-low voltage transients. The current switching circuit conserves power consumption by switching off the relaxation current during logic low-to-high transients, during which time the emitter followers switch sufficiently fast. The level shifting circuit converts the set of ECL logic voltage levels to a set of CMOS voltage levels and the CMOS output voltage is used to control the current switching circuit without introducing a switching delay time.

12 Claims, 3 Drawing Sheets

LOGIC LEVEL SHIFTING CIRCUIT WITH MINIMAL DELAY

TECHNICAL FIELD

This invention generally relates to electronic circuits, and more particularly, to voltage level shifting circuits.

BACKGROUND OF THE INVENTION

The operational speed of modern computers is extremely important because of the very large and complex algorithms that computers are required to process within a very short space of time. In the past, computers having the fastest operational speed have typically used emitter-coupled logic or ECL, although recently the operational speed of CMOS logic devices has tended to improve to the point where CMOS logic devices are equally as fast as ECL devices. An advantage of CMOS logic devices is the high degree of integration attainable using such structures. A disadvantage of ECL is the substantial power consumption during circuit operation due to the necessity of biasing the semiconductor devices in a linear operating region. CMOS logic devices in contrast, have a much lower power consumption. Notwithstanding the advances in CMOS performance, it still remains necessary for CMOS circuits to interface with existing "peripheral" ECL circuits for reasons of compatibility. In order to achieve compatibility, a voltage level shifting circuit is required to convert a set of ECL logic voltage levels (approximately ($-0.9$) volt for a logic high and ($-1.7$) volts for a logic low) to a set of CMOS logic voltage levels (typically greater than 2.20 volts for a logic high and less than 0.8 volt for a logic low).

Logic level shifting circuits are required to have stringent circuit specifications to achieve optimum speed performance. For example, it is necessary to maintain a specified voltage differential between a defined ECL logic high and a defined ECL logic low with small variation. The voltage differential is also required to be substantially invariant with temperature and immune to electrical noise. A further requirement of the voltage level shifting circuit, for implementation in CMOS technology, is low power consumption and high operational speed.

A known logic level shifting circuit is taught by B. L. Morris in U.S. Pat. No. 4,943,741 entitled "ECL/CML Emitter Follower Current Switch Circuit". An advantage of the circuit described by B. L. Morris is the reduction in power consumption which is attained by relaxation current switching. The relaxation current is provided to enhance the operational speed of the emitter follower and is switched off during certain periods of operation when the relaxation current is not required. A disadvantage of this circuit, however, is the relatively slow switching speed due to a cross-coupling of voltages in a flip-flop type of circuit. The delay time occurs because the cross-coupled voltages have to overcome the barrier potential or cutin voltage of two semiconductor devices.

SUMMARY OF THE INVENTION

Briefly, the present invention provides an improved logic level shifting circuit for converting between a first set of logic voltage levels and a second set of logic voltage levels, such as ECL to CMOS levels. In accordance with one embodiment of the invention, a first current source is coupled to a current steering portion. The current steering portion has differential mode inputs for receiving differential mode input voltages associated with a first set of logic levels. The input current steering portion has a first pair of differential outputs with each output providing a current proportional to the differential mode input voltages. A first pair of passive loads is respectively coupled to the first pair of differential outputs of the current steering portion for providing a first pair of voltages in response to the currents from the current steering portion. A pair of voltage followers is respectively coupled to the first pair of voltages for providing a second pair of voltages associated with the first set of logic levels. A pair of switched current control devices is respectively coupled to the outputs of the pair of voltage followers. A second current source is coupled to the pair of switched current control devices for providing a predetermined current to the pair of switched current control devices. A buffer is coupled to the second pair of voltages and provides a third pair of output voltages associated with a second set of logic levels and is coupled to the pair of switched current control devices.

These and other features and advantages will be more clearly understood from the following detailed description taken in conjunction with the accompanying drawings.

DETAILED DESCRIPTION OF THE INVENTION

Switching characteristics of semiconductor devices are an important consideration in the design of very fast computer circuits. FIGS. 1 (A–C) present a series of illustrations which clarify the switching characteristics of a bipolar transistor which is connected as a known voltage follower circuit. The voltage follower circuit forms the basic building block of emitter-coupled-logic circuits or ECL.

Figure 1A:
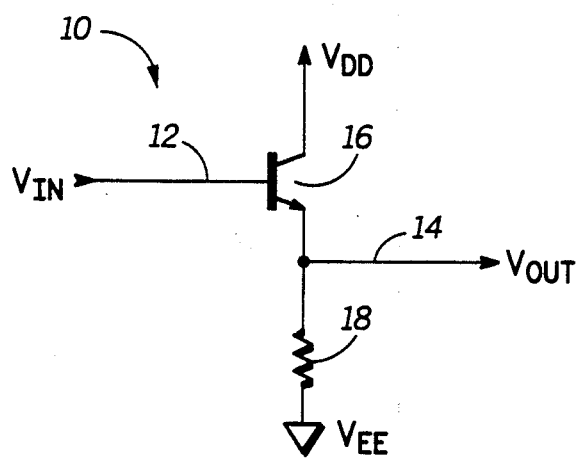
FIG. 1(A) illustrates, in schematic form, a known emitter follower circuit.

FIG. 1(A) illustrates, in schematic form, a voltage follower circuit 10 having a Vin input 12 and a Vout output 14. Circuit 10 comprises an NPN bipolar transistor 16 having a collector connected to a supply voltage $V_{DD}$ and an emitter coupled to $V_{EE}$ through a resistor 18. A base of transistor 16 provides the Vin input 12.

In operation, circuit 10 functions as a non-inverting voltage follower having unity gain. When the Vin input 12 has a logic low-to-high input voltage transition, the Vout output 14 will follow as a logic low-to-high output voltage transition. In switching from a logic low-to-high, the output voltage at Vout output 14 switches very fast as current is rapidly pulled up from ground by transistor 16 through resistor 18. In the reverse switching mode, when the output transitions from logic high-to-low, the output voltage at Vout output 14 of circuit 10 transitions relatively slowly because there is no current path to $V_{EE}$ except through resistor 18. Therefore, a relaxation current is required to flow to ground in order to pull-down the voltage on the emitter of transistor 16.

Figure 1B:
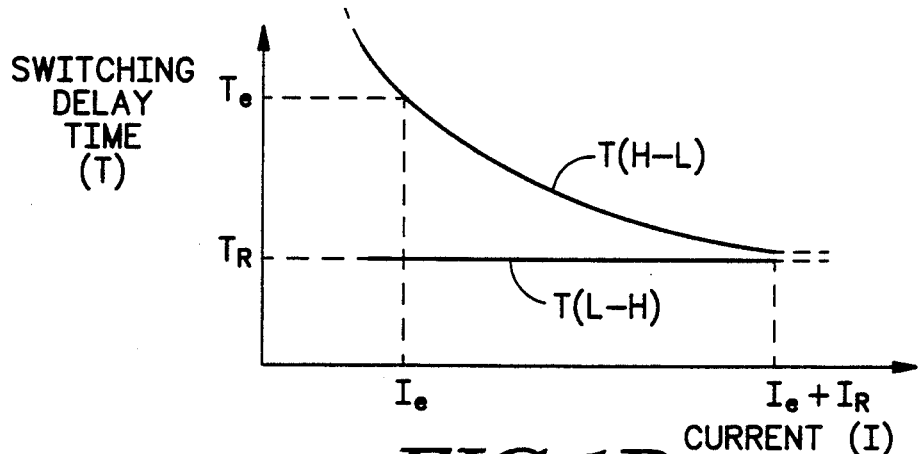
FIG. 1(B) illustrates switching characteristics of the emitter follower circuit of FIG. 1(B).

FIG. 1(B) illustrates, in graphical form, a switching characteristic of circuit 10. The graph illustrates a relationship between a dependent variable delay time, T, and an independent variable emitter current, Ie. A curve labeled T(L-H) illustrates the switching characteristic for a logic low-to-high voltage transient demonstrating that the switching delay is independent of the magnitude of the emitter current. A curve labeled T(H-L) illustrates the switching characteristic of a logic high-to-low voltage transient demonstrating that switching speed, for this polarity, is dependent upon the magnitude of emitter current. For instance, referring to the graph illustrated in FIG. 1(B) an emitter current Ie, marked on the graph, has a delay time equal to Te. An emitter current Ie+Ir, marked on the graph, has a delay time of Tr. From these curves, it is possible to conclude that if a design includes an additional current equal to Ir, then the T(H-L) voltage transient can be made faster and reduces the delay time from Te to Tr. The additional current, Ir, required to operate on the curve T(L-H) where the delay time is minimized, is referred to as the relaxation current.

Figure 1C:
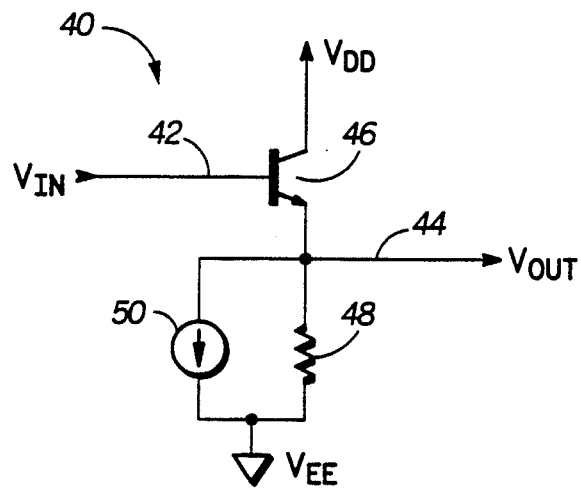
FIG. 1(C) illustrates, in schematic form, another known emitter follower circuit.

FIG. 1(C) illustrates, in schematic form, a voltage follower circuit 40 having a Vin input 42 and a Vout output 44. Circuit 40 comprises an NPN bipolar transistor 46 having a collector connected to a supply voltage $V_{DD}$ and an emitter connected to a first terminal of a current source 50. A second terminal of current source 50 is connected to $V_{EE}$. The emitter of transistor 46 is also coupled to $V_{EE}$ through a resistor 48.

In operation, circuit 40 functions as a non-inverting voltage follower having a unity voltage gain. When Vin input 42 has a logic low-to-high input voltage transition, the voltage at Vout output 44 will follow as a logic low-to-high voltage transition. In switching from a logic low-to-high, the output voltage at Vout output 44 switches extremely fast and current is rapidly pulled up from $V_{EE}$, through resistor 48 by transistor 46. In the reverse switching mode, when Vin input 42 has a logic high-to-low transition, the voltage at Vout output 44 relaxes very quickly to zero volts due to the availability of a relaxation current which is provided by current source 50.

Figure 2:
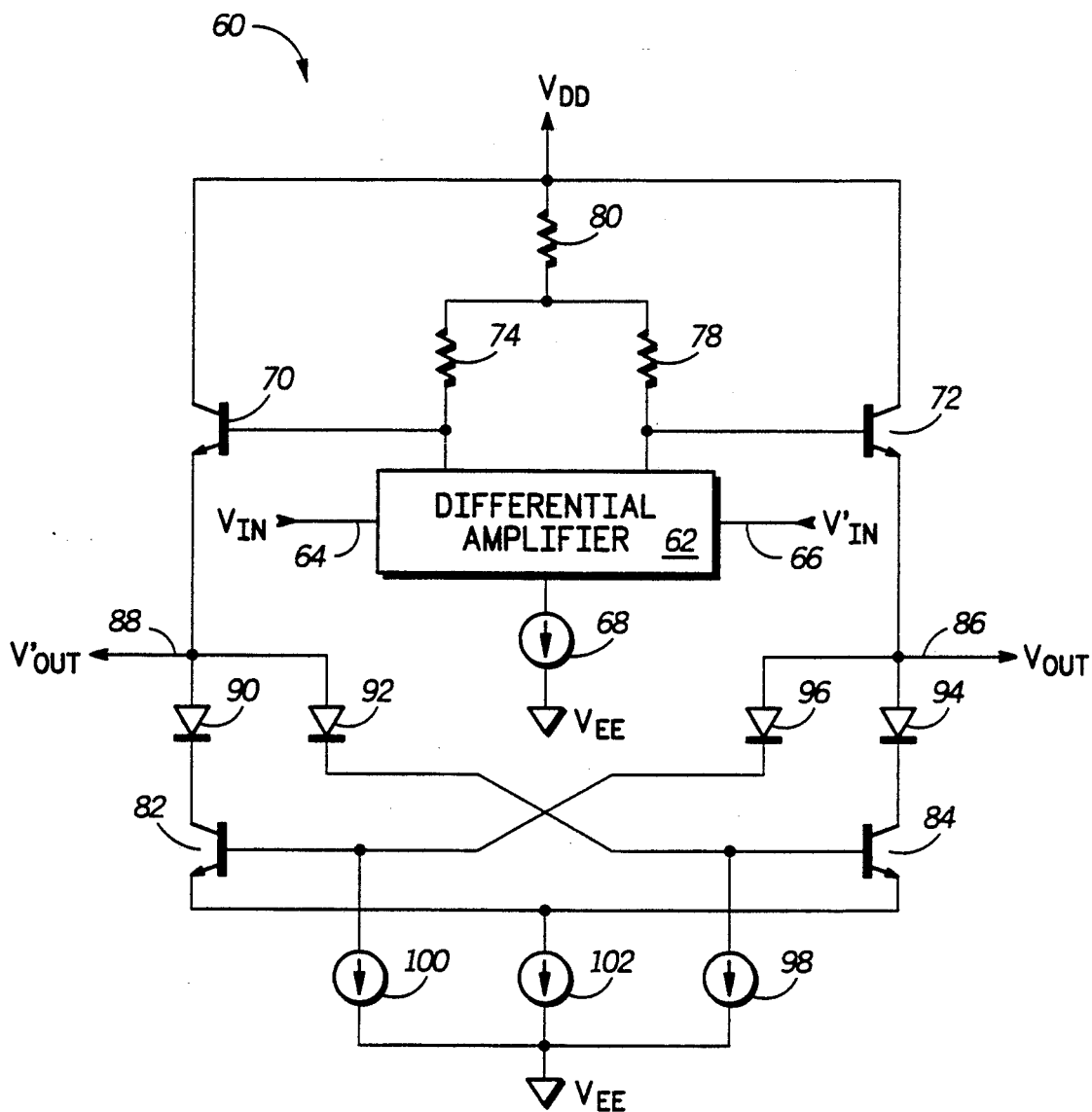
FIG. 2 illustrates, in partial schematic form, a known ECL/CML emitter follower current switch circuit.

FIG. 2 illustrates, in partial schematic form, a circuit 60 which is a known ECL/CML emitter follower current switch circuit. Circuit 60 comprises a differential amplifier 62, two emitter followers respectively comprised of transistors 70 and 72, and a switching portion comprised of transistors 82 and 84. Differential amplifier 62 has a Vin input 64 and a logic complementary Vin' input 66. Three important nodes are associated with differential amplifier 62. The first node is connected to a current source 68, a second node is connected to a base of transistor 70 and to a load resistor 74, and a third node is connected to a load resistor 78 and to a base of transistor 72. Load resistors 74 and 78 are connected to a load resistor 80 which is connected to a voltage supply $V_{DD}$. Circuit 60 has two emitter follower circuit portions respectively comprising transistors 70 and 72. Collectors of transistors 70 and 72 are connected to supply voltage $V_{DD}$. A current switching portion of circuit 60, having a Vout output 86 and a logic complementary Vout' output 88, is comprised of transistors 82 and 84. An emitter of transistor 70 is connected to a complementary Vout' output 88, and to an anode of a diode 90, and to an anode of a diode 92. An emitter of transistor 72 is connected to Vout output 86 and to an anode of diode 94, and to an anode of diode 96. A cathode of diode 90 is connected to a collector of transistor 82, and a cathode of diode 92 is connected to a base of transistor 84 and to a first terminal of a current source 98. A second terminal of current source 98 is connected to $V_{EE}$. A cathode of diode 94 is connected to a collector of transistor 84, and a cathode of diode 96 is connected to a base of transistor 82 and to a first terminal of a current source 100. A second terminal of current source 100 is connected to $V_{EE}$. Emitters of transistors 82 and 84 are each connected to a first terminal of a current source 102. A second terminal of current source 102 is connected to ground.

In operation, circuit 60 functions as two emitter followers comprising transistors 70 and 72 respectively having differential input signals provided by differential amplifier 62. An advantage of differential amplifier 62 is the ability to reject common mode noise. Since the operational speed of an emitter follower is dependent upon the voltage polarity of the logic voltage transient, as previously described in connection with FIGS. 1(A-C), a relaxation current is provided by current source 102. Another advantage of circuit 60 is a saving in power consumption which is obtained by switching off the relaxation current during logic transients. A disadvantage of circuit 60 is the inherent delay time which is introduced by the relaxation current switching circuit portion comprising transistor 82 and transistor 84. The delay time is apparent when considering some of the voltage transients occurring within circuit 60. For example, at the instant in time when the voltage at Vout output 86 begins to transition from a logic high-to-low voltage, transistor 84 is initially off, due to cross-coupling of the complementary output voltage at the Vout' output 88 to the base of transistor 84. The time delay required for transistor 84 is the time taken for the complementary voltage at Vout' output 88 to overcome a barrier potential or cutin voltage associated with diode 92 and with another barrier potential Vbe or cutin voltage associated with transistor 84. The delay time introduced by the time taken for the voltage to rise above the barrier potentials described previously is detrimental to the performance of fast static RAMs.

Figure 3:
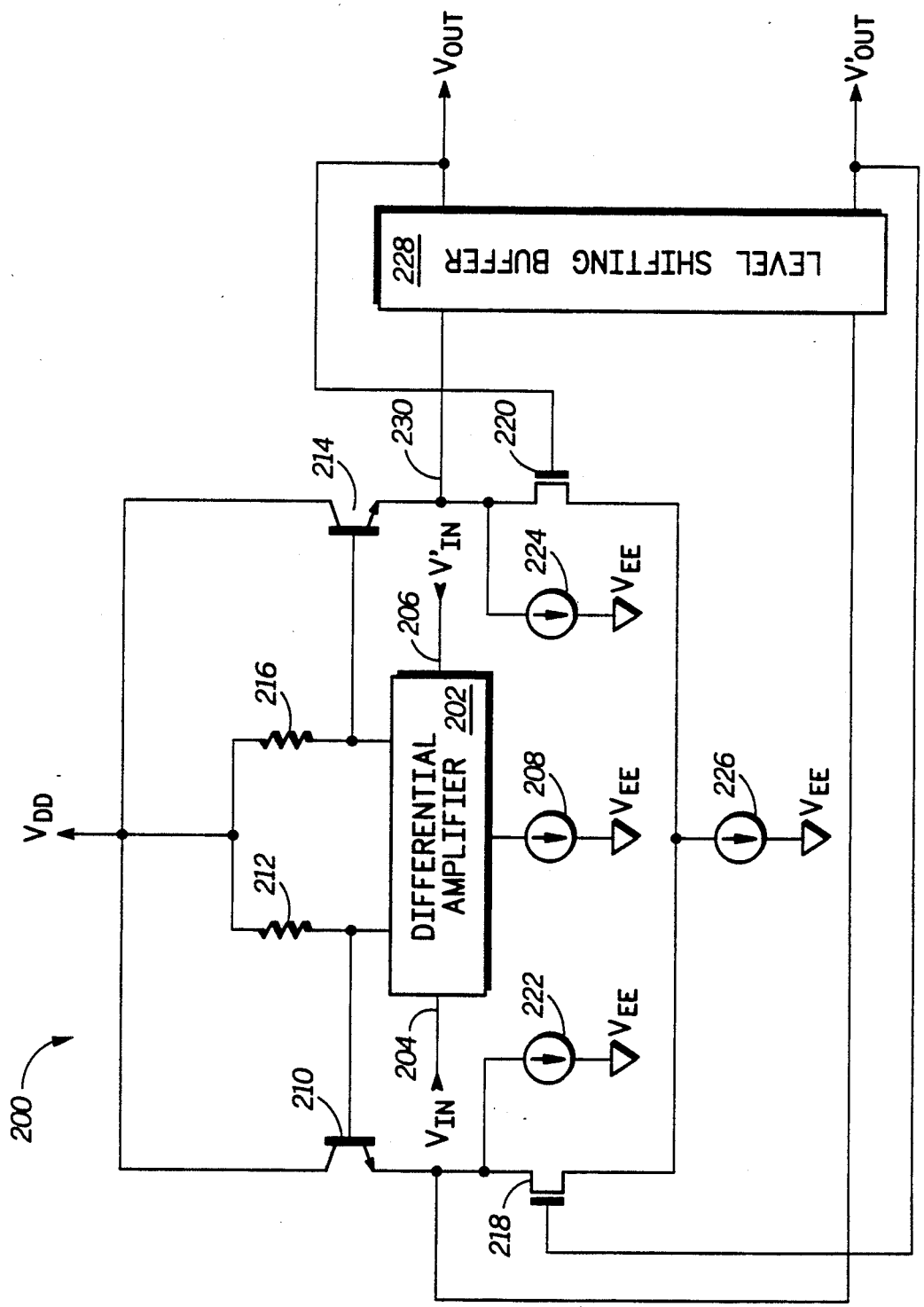
FIG. 3 illustrates, in partial schematic form, a level shifting circuit in accordance with the present invention.

FIG. 3 illustrates, in schematic form, a logic level shifting circuit 200 for converting between ECL and MOS voltage levels, in accordance with the present invention. The ECL Vin and Vin' voltage levels are typically referred to the more positive power supply ($V_{DD}$) while CMOS levels are referred to the more negative power supply ($V_{EE}$). In ECL systems, the more positive power supply is typically connected to system ground. Circuit 200 generally comprises a differential amplifier, two emitter follower circuits, and a switching portion. A differential amplifier 202 has a Vin input 204 and a logic complementary Vin' input 206. Three important nodes are associated with differential amplifier 202. A first node is a connection to a first terminal of a current source 208, a second node is a connection to a base of a transistor 210 and to a first terminal of a resistor 212, and a third node is connected to a base of a transistor 214 and to a first terminal of a load resistor 216. A second terminal of current source 208 is connected to $V_{EE}$ A second terminal of resistors 212 and 216 are connected to a supply voltage $V_{DD}$. In circuit 200, the two emitter follower circuit portions are comprised of transistors 210 and 214, respectively. Collectors of transistors 210 and 214 are connected to supply voltage $V_{DD}$. A current switching portion of circuit 200 is comprised of transistors 218 and 220. A transistor 218 has a drain connected to emitter of transistor 210 and to a first terminal of a current source 222. A second terminal of current source 222 is connected to $V_{EE}$. A gate of transistor 218 is connected to the complementary Vout' output. A level shifting buffer 228 provides a Vout output and a logic complementary Vout' output and has a first input connected to the emitter of transistor 214 and a second input connected to the emitter of transistor 210. A gate of transistor 220 is connected to Vout output of level shifting circuit 228. A drain of a transistor 220 is connected to an emitter of transistor 214, to a first terminal of a current source 224, and to a level shifting buffer input 230. A second terminal of a current source 224 is connected to $V_{EE}$. Sources of transistors 218 and 220 are connected to a first terminal of a current source 226. A second terminal of current source 226 is connected to $V_{EE}$.

In operation, circuit 200 functions to level shift a set of logic voltage levels between ECL and CMOS logic voltage levels in a very fast manner. The voltage level shifting function is provided by a level shifting buffer 228. Differential amplifier 202 functions as a pre-amplifier and provides a differential output signal for two voltage follower circuits. The voltage follower circuit portion is comprised of transistors 210 and 214, respectively. Due to symmetry, it is only necessary to consider one of the voltage followers. When input Vin has a logic ECL low, the base of transistor 210 will be at logic high. Since Vin has a logic ECL low, Vin' has an ECL logic high and the base of transitor 214 is a logic low. Therefore, at node 230, the first input to level shifting buffer 228 is an ECL low and output Vout is a CMOS logic low. Therefore, Vout' has a CMOS logic high which is coupled to the gate of transistor 218 to turn on transistor 218. Since the base of transistor 210 is at a logic high and the base of transistor 218 is at a logic low, a relaxation current path to $V_{EE}$ is provided and transistor 210 transitions very rapidly from high to low. As previously described, a high operational speed is obtained with the use of a relaxation current. Power consumption savings are achieved by switching off the relaxation current during logic low-to-high voltage transients at the gates of transistors 218 and 220. The relaxation currents of circuit 200 are switched off by a switching circuit portion respectively comprising transistors 218 and 220 with feedback control which is derived from Vout and Vout' outputs. In contrast with the operation of circuit 60 of FIG. 2, as previously described, circuit 200 does not suffer from an inherent circuit delay time, such as the delay time required to overcome a given threshold voltage. The reason that the delay time is not inherently present in circuit 200, of the present invention, is because of the absence of a circuit cross-coupling network that introduces a barrier potential, for the voltage to overcome, which inhibits the switching of the relaxation current. In other words, the correct logic state has already been applied to the gates of transistors 218 and 220 so that there is no delay in providing a relaxation current. By symmetry, voltages associated with the emitter follower comprising transistor 210, behave similarly. Level shifting buffer 228 adjusts the voltage level appearing at node 230 to a new voltage level which is available at the Vout output. For example, if the voltages at node 230 are from a circuit having bipolar transistors such as transistors 210 and 214, level shifting buffer 228 can be designed to shift ECL voltages to a set of CMOS logic voltage levels, appearing at Vout output. Level shifting buffer 228 approximately introduces a one nanosecond delay which further enhances the switching speed of the current switching circuit. Advantages of circuit 200 of the present invention include low power consumption without a tradeoff or sacrifice in speed.

By now it should be apparent that there has been provided a logic level shifting circuit for converting between a first voltage level and a second voltage level, such as between a set of ECL voltage levels and a set of CMOS logic voltage levels. The logic level shifting circuit comprises a differential amplifier functioning as a current steering device, a current switching portion and a level shifting circuit portion. The current steering device, which is a differential amplifier, has an advantage of providing common mode rejection. The current switching portion has an advantage of providing a saving in power consumption without introducing a degradation in operational speed. The voltage level shifter allows a conversion of a variety of voltage levels without substantially changing the performance of circuit 200.

While there have been described herein the principles of the invention, it is to be clearly understood by those skilled in the art that this description is made only by way of example and not as a limitation to the scope of the invention. For example, the voltage levels to be shifted need not necessarily be ECL to CMOS, but may also incorporate CMOS to ECL, ECL to ECL, and CMOS to CMOS. Accordingly, it is intended, by the appended claims, to cover all modifications of the invention which fall within the true spirit and scope of the invention.

We claim:

1. A logic level shifting circuit with minimal delay comprising:

a first current source;

current steering means coupled to the first current source and having differential mode inputs for respectively receiving differential mode input voltages associated with a first set of logic levels and having a first pair of differential outputs, each providing a current proportional to the differential mode input voltages;

a first pair of passive loads respectively coupled to the first pair of differential outputs of the current steering means, for providing a first pair of voltages in response to the currents, each voltage of the first pair of voltages provided in response to a predetermined one of the currents from the current steering means;

a pair of voltage followers respectively coupled to the first pair of voltages for respectively providing at a second pair of voltages associated with the first set of logic levels;

a pair of switched current control means respectively coupled to a second pair of voltages of the pair of voltage followers;

a second current source coupled to the pair of switched current control means for providing a predetermined current to the pair of switched current control means; and buffer means coupled to one of the second pair of voltages and providing a third pair of output voltages associated with a second set of logic levels and coupled to control electrodes of the pair of switched current control means.

2. The level shifting circuit of claim 1 wherein the pair of voltage followers comprise a pair of emitter followers.

3. The level shifting circuit of claim 1 wherein the pair of voltage followers comprise a pair of source followers.

4. The level shifting circuit of claim 1 wherein the current steering means comprise an emitter coupled pair of transistors.

5. The level shifting circuit of claim 1 wherein at least one of the first and second current sources selectively provides current in response to a control signal.

6. The level shifting circuit of claim 1 wherein the pair of switched current control means comprises a first field effect transistor coupled in parallel with a third current source and a second field effect transistor coupled in parallel with a fourth current source.

7. The level shifting circuit of claim 1 wherein the second set of logic levels has a greater excursion than the first set of logic levels.

8. The level shifting circuit of claim 1 wherein the current steering means comprises a differential amplifier.

9. A logic level shifting circuit with minimal delay for providing first and second output voltages respectively having a first set of logic levels in response to receiving first and second input voltages respectively having a second set of logic levels, comprising:

a differential amplifier having first and second inputs for receiving first and second input voltages respectively having first and second logic levels associated with a first set of logic levels, and having first and second output terminals and a third output terminal;

a first current source having a first terminal coupled to the third output terminal, and a second terminal coupled to a first reference voltage terminal;

a first resistor having a first terminal coupled to the first output terminal of the differential amplifier, and a second terminal coupled to a second reference voltage terminal;

a second resistor having a first terminal coupled to the second output terminal of the differential amplifier, and a second terminal coupled to the second reference voltage terminal;

a first transistor of a first processing type having a first current electrode coupled to the second reference voltage terminal, a control electrode coupled to the first output terminal of the differential amplifier, and a second current electrode;

a second transistor of the first processing type having a first current electrode coupled to the second reference voltage terminal, a control electrode coupled to the second output terminal of the differential amplifier, and a second current electrode;

a third transistor of a second processing type having a first current electrode coupled to the second current electrode of the first transistor, a control electrode, and a second current electrode;

a fourth transistor of the second processing type having a first current electrode coupled to the second current electrode of the second transistor, a control electrode, and a second current electrode;

a second current source having a first terminal coupled to the second current electrodes of the third and fourth transistors, and a second terminal coupled to the first reference voltage terminal;

a third current source having a first terminal coupled to the first current electrode of the third transistor, and a second terminal coupled to the first reference voltage terminal;

a fourth current source having a first terminal coupled to the first current electrode of the fourth transistor, and a second terminal coupled to the first reference voltage terminal; and buffer means having an input coupled to the second current electrode of the second transistor, a first output coupled to the control electrode of the third transistor, and a second output coupled to the control electrode of the fourth transistor, said buffer means providing a pair of output voltages respectively having first and second logic levels associated with a second set of logic levels.

10. The logic level shifting circuit of claim 9 wherein the first and second transistors of first processing type are bipolar transistors.

11. The logic level shifting circuit of claim 10 wherein the third and fourth transistors of second processing type are MOS transistors.

12. The logic level shifting circuit of claim 9 wherein the first set of logic levels are ECL logic levels and the second set of logic levels are MOS logic levels.

* * * * *